US 6,686,566 B1

(12) United States Patent
Corey

(10) Patent No.: US 6,686,566 B1
(45) Date of Patent: Feb. 3, 2004

(54) INFRARED DRYING AND CURING SYSTEM FOR CIRCUIT BOARDS

(76) Inventor: Dave O. Corey, 9109 Williams Rd., Rogers, AR (US) 72756

( * ) Notice: Subject to any disclaimer, the term of this patent is extended or adjusted under 35 U.S.C. 154(b) by 82 days.

(21) Appl. No.: 10/099,674

(22) Filed: Mar. 15, 2002

(51) Int. Cl.⁷ .............................................. B65G 15/10
(52) U.S. Cl. ...................... 219/388; 219/400; 219/411; 198/817
(58) Field of Search ................................ 219/388, 400, 219/411; 34/267, 273, 274, 210, 216, 232, 233, 235, 451, 480; 198/793, 799, 802, 817

(56) References Cited

U.S. PATENT DOCUMENTS

| | | | | |
|---|---|---|---|---|
| 3,239,651 A | * | 3/1966 | Silberman ................... | 219/388 |
| 4,833,301 A | | 5/1989 | Furtek ........................ | 219/388 |
| 4,978,836 A | | 12/1990 | Dieudonne et al. ......... | 219/388 |
| 4,987,290 A | * | 1/1991 | Okuno ........................ | 392/375 |
| 5,567,237 A | | 10/1996 | Kapp-Schwoerer et al. .. | 118/58 |
| 5,683,242 A | * | 11/1997 | Cronin et al. ............... | 432/144 |
| 6,107,606 A | * | 8/2000 | Hotchkiss ................... | 219/411 |
| 6,170,647 B1 | * | 1/2001 | Miura ........................ | 198/817 |
| 6,471,045 B1 | * | 10/2002 | Harden ....................... | 198/817 |
| 2002/0155223 A1 | * | 10/2002 | Colvin et al. ............... | 427/303 |

* cited by examiner

*Primary Examiner*—Joseph Pelham
(74) *Attorney, Agent, or Firm*—Keisling Pieper & Scott, PLC; Trent C. Keisling; David B. Pieper

(57) ABSTRACT

The present invention efficiently and safely combines directed air flow for drying and heat removal with panel infrared emitters that provide thermal energy for curing LPI solder mask and legend inks onto printed circuit boards being transported though an area with pneumatic and radiant processes occurring simultaneously. The internal geometric configuration of the apparatus and high velocity input air results in an airflow stream in relation to the panel infrared emitters that ensures any flammable vapors are kept separated from the infrared emitters.

19 Claims, 10 Drawing Sheets

INFRARED DRYING AND CURING SYSTEM FOR CIRCUIT BOARDS

CROSS-REFERENCE TO RELATED APPLICATIONS

Not Applicable.

STATEMENT REGARDING FEDERALLY SPONSORED RESEARCH OR DEVELOPMENT

Not Applicable.

REFERENCE TO A MICROFICHE APPENDIX

Not Applicable.

BACKGROUND OF THE INVENTION

1. Field of the Invention.

The present invention relates to a small, fast, and energy efficient printed circuit board curer-dryer oven apparatus for liquid photoimaginable solder masks and legend inks. In particular, the present invention has a small compact size resulting from a geometrical component configuration that facilitates the simultaneous application of thermal infrared radiation for curing and drying coupled with pneumatic air for evaporative and conductive cooling of the printed circuit board and for evacuative transport of potentially flammable vapors. This particular employment of curing heat from infrared emitters instead of convection from hot air allows energy efficiency to be obtained from the extremely short preparatory time such emitters require and the elimination of the necessity of keeping the curing chamber at a steady temperature. Known art may be found in U.S. Classes 219, 118, in subclasses 58, 388 respectively as well as in other classes and subclasses.

2. Description of the Known Art

To produce the conductors on printed circuit boards with thin fiberglass expoxy cores that are coated with metallic foil, usually copper, coating with a photoresist or with a similar photosensitive and developable polymer layer is one step in a multiple step process. The desired structure of conductors is exposed on the dried coating, and the coating is either developed at the exposed or with alternate types of photoresist at the unexposed places. In the three step etching process that follows, the photoresist coating is first dissolved away at the non-circuit areas. Then the copper is etched away at the uncovered places, whereas the coated places are protected from the etching effect. Then the remainder of the photoresist coating is dissolved resulting in the in-layer or printed circuit board having the desired structure of conductors.

The printed circuit boards are subsequently processed by applying a solder mask, i.e. a coating applied to a printed circuit board after the circuits are established but prior to component electronic installation. The function of a solder mask is to reduce the ability of the molten solder to adhere to the printed circuit board surface. A solder mask is typically applied by screen printing using artwork which enables the entire board to be covered except for the holes, pads, and contact fingers.

Ideally, after any soldering operation solder adheres only to th solder plated hole, and the component lead in the hole. In reality without solder mask, solder will not only stick to the dielectric substrate (the fiberglass and plastic material which the board is fabricated from), it will also bridge across that substrate and short circuit the conductors. With the application of hard, resistant solder masks, the ability of molten solder to adhere to the board surface is greatly reduced.

There are other reasons for applying solder mask. In actuality, solder mask need only be applied to the solder side (that side which will contact the solder wave). However, it is common for printed circuit users to require solder mask on both the component and solder sides. Solder mask also acts as a barrier which prevents damage to the circuitry due to scratches. Solder mask also prevents short circuits from forming when stray wires or dirt contaminates the surface. Printed circuits that must function in environments of high humidity are better protected from corrosion with solder mask.

The four common types of solder masks are: (1) two part epoxy, (2) one part epoxy, (3) ultraviolet curable and (4) dry film solder mask. The type of solder mask of principal relevance are those with involving epoxy. Previously, the applied solder masks were cured to hardness, heat resistance, and chemical resistance by baking in an oven with hot air circulation. The general objective of the curing process is to remove any volatiles (if present) and to chemically cross link and/or polymerize the solder mask. Curing toughens the solder mask to help ensure that it will maintain its integrity during the chemical, thermal, electrical, and physical exposure the printed circuit board will be subjected to during its service life.

A solder mask coating installation is where the printed circuit boards have a layer or coating applied. Immediately after the solder mask is applied, the board is cured which is a simultaneous hardening and evaporation of volatile compounds. Evaporation and simultaneous hardening has been accomplished in both batch and conveyorised thermal convective ovens and combination thermal radiant infrared (IR) convective ovens. The curing process leaves a liquid mask at a certain hardness that maintains the surface integrity and makes the boards more durable to physical abrasions. The gas, in the curing chamber, generated through evaporation is transported away from the printed circuit board to the outside air. An apparatus for scrubbing the exhaust vapors is usually available to be put in the transport path of the exhaust stream so that any potentially toxic vapors can be captured. Similarly, a clean air filter can be put in the air inlet orifices for removing solid impurities from incoming air.

In order to obtain the desired throughput, printed circuit boards have to be cured in a relatively short time. For that purpose, the curing stations are usually in the form of a conveyorised oven apparatus in which the coated printed circuit board is dried and cured during its transport from an entry opening to an exit opening. The coating has been normally dried in a stream of hot air that is passed over the surface of the board. There are also continuous curers in which the coating is dried and cured by means of convective hot air streams coupled with infrared (IR) radiation. As a rule, circulating hot air drying steps have been preliminary to those involving infrared emitters in order to evaporate off and transport away any flammable solvent present in the coating. Such preliminary drying has been deemed absolutely essential in the case of conventional infrared curers for safety reasons since, without it, the flammable solvent vapors, which would not be evaporated out and off until the infrared emitters were reached, could ignite upon contact with the hot surface of the infrared emitter.

In the past, an important factor determining the duration of the curing of the coating has been the temperature inside the continuous curer. It could not be set to an arbitrarily high level since that would undesirably increase the risk of igniting any remaining flammable solvent vapors. When infrared emitters were used, there was the additional risk that the liquids contained in the coating would evaporate too quickly and form bubbles (boiling bubbles), which could severely impair the evenness and the quality of the coating and could even result in an unusable printed circuit board. There have been, therefore, limits to shortening the throughput times in conventional known continuous curer-driers. The need for consecutive steps in the previous curing and drying techniques have lead to a large dimension in the conveyorised curing and drying path so that each step in the curing-drying process could essentially be completed prior to the commencement of the next step. The need to keep the curing chamber at a given temperature range has operational requirements of either a long warm-up time or that the heating elements be continually on thus requiring a continuous energy input. Energy efficiency could be improved either though shorter warm-up times which would be coupled with not having to maintain a constant temperature in the curing and drying chamber.

The continuous oven described in U.S. Pat. No. 4,978,836 is a continuous infrared oven whose function is to accomplish reflow soldering where surface mounted devices are attached to printed circuit boards. As a solder apparatus, its applicability to the curing-drying process for legend inks and photoimaginable solder masks is only marginal.

Another infrared oven described in U.S. Pat. No. 4,833,301 has a multi-zone temperature environment controlled by the infrared emitters via their control of emitted thermal infrared wavelengths. As this invention pertains to a reflow soldering apparatus, its applicability to the curing-drying process for legend inks and photoimaginable solder masks for printed circuit boards is only marginal.

A continuous oven for board shaped piece material described in U.S. Pat. No. 5,567,237. This device uses three zones of differing wavelength infrared emitters to provide a ramp of incremental temperatures increases coupled with directed air flow parallel to the printed circuit board's surface and counter to the printed boards travel direction. This arrangement with parallel airflow differs substantially from the curer-dryer oven of the present invention.

Thus, a need exists for an improved small, fast, and energy efficient printed circuit board curer-dryer oven apparatus for liquid photoimaginable solder masks and legend inks that also has auto-loading and unloading capability.

SUMMARY OF THE INVENTION

The present invention addresses the need in the art for an improved curer-dryer apparatus. One principal object of the present invention is to provide a conveyorised printed circuit board curer that permits a rapid throughput, that is to say rapid curing of printed circuit boards without at the same time impairing the quality of the coating. In accordance with the present invention, this system utilizes a combination of infrared panel emitters and pneumatic airflow characteristics to control heat accumulation and dispersal as well as to compartmentalize the vapors generated during the curing process.

The present invention efficiently and safely combines directed air flow for drying and heat removal with panel infrared emitters that provide thermal energy for curing printed circuit boards being transported though an area with pneumatic and radiant processes occurring simultaneously. The internal geometric configuration of the apparatus and high velocity input air results in an airflow stream in relation to the panel infrared emitters that ensures any flammable vapors are kept separated from the infrared emitters.

In one exemplary embodiment of the present invention, a conveyorised curing-drying oven uses both convective and radiant heat transport to the printed circuit boards for curing. The infrared panels generally have a high efficiency for energy conversion and generate only a small amount of waste heat. Little or no waste heat results in a curing-drying chamber that requires minimal insulation to protect the operators as well as to provide an acceptable temperature profile in the immediate vicinity of the curing-drying chamber. The curing-drying chamber does not require elevated temperatures or even the maintenance at a given temperature range for curing and drying printed circuit boards. The initialization time, i.e. that time from when the apparatus is switched on until it is ready to begin processing printed circuit boards, is extremely short as the panel infrared emitters are the only operational components that require time to attain the desired operating status. The panel infrared emitters began producing a sufficient radiation flux density in the acceptable wavelengths (for example medium thermal infrared) and attain operational temperature status in less than one minute.

The satisfaction of the requirements with regard to explosion protection is to be maintained to thus avoid ignition of the solvent evaporated during the curing process. This is especially true as it relates to the geometry of panel infrared emitters and transport paths for incoming air and exiting flammable vapors.

In accordance with one exemplary embodiment of the present invention, an oven with a protective shroud and internal frame directs incoming air flow for drying and heat removal through panel infrared emitters that provide thermal energy for curing printed circuit boards being transported though a chamber where the pneumatic and radiant processes are occurring simultaneously. The geometric configuration of the air flow stream in relation to the panel infrared emitters is such that if any flammable vapors are produced, these vapors are kept separated from the infrared emitters.

The conveyorised curing-drying apparatus does not depend substantially upon convective heat transport to the printed circuit boards for curing but does use convective heat transport via directed air to cool the printed circuit boards. The infrared panels generally have a high efficiency for energy conversion and generate only a small amount of waste heat.

The curing-drying chamber does not require elevated temperatures or even the maintenance at a given temperature range for curing and drying printed circuit boards since the initialization time or the time from when the apparatus is switched on until it is ready to begin processing printed circuit boards, is extremely short as the panel infrared emitters are the only operational components that require time to attain the desired operating status. The panel infrared emitters began producing a sufficient radiation flux density in the acceptable wavelengths in less than one minute.

Thus, a principal object of the present invention is to provide an apparatus having highly energy efficient operation as compared to older curing methods and devices.

Another object of the present invention is to provide a highly efficient apparatus with compact dimensions that is inexpensive in design and that require little additional operator instruction for its satisfactory operation.

Yet another object of the present invention to provide a device having the capability of being coupled with various coating or inking installations on such a manner as to further automate circuit board production by allowing the end products of coating or inking to be mechanically input directly into and out of the curing oven without being subjected to manual manipulation.

Another object of the present invention is to facilitate adjustable throughput capacity and productivity to accommodate different requirements of various manufacturing facilities without requiring excessive alteration and modification.

Another object of the present invention is to provide an improved apparatus that produces satisfactory finished components quickly and economically while maintaining a safe operating environment.

A basic object of the present invention is to provide a device using thermal radiation and turbulent airflow to quickly cure and dry printed circuit boards.

Another principal object of the present invention is to provide a device with directed air streams that maximize desirable curing characteristics while minimizing undesirable vapor transportation characteristics to thereby hasten printed circuit board curing and drying while preserving a safe operating environment.

These and other objects and advantages of the present invention, along with features of novelty appurtenant thereto, will appear or become apparent in the course of the descriptive sections.

BRIEF DESCRIPTION OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
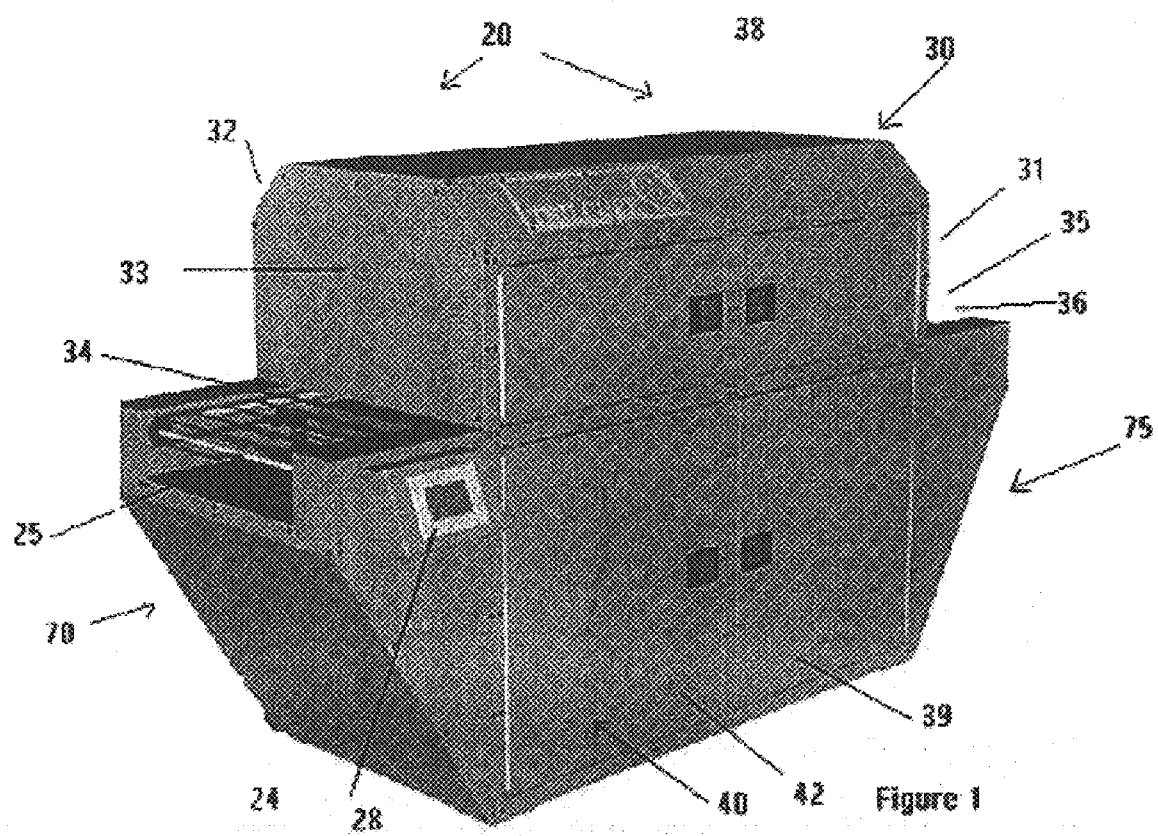
FIG. 1 is an environmental view showing an exemplary embodiment of the printed circuit board curer-dryer oven apparatus in accordance with the present invention.
Figure 2:
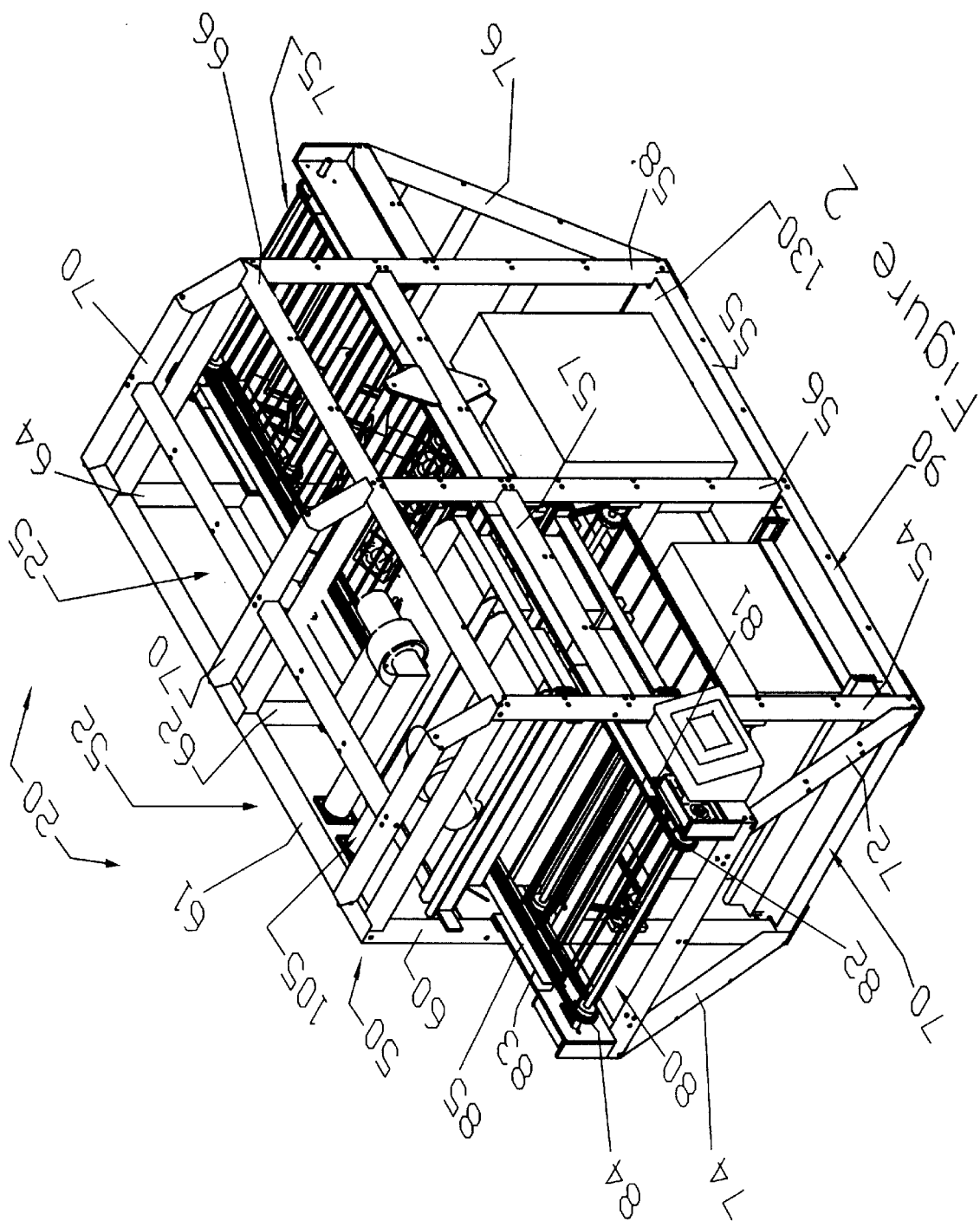
FIG. 2 is a perspective view taken generally from the front thereof, with portions omitted for clarity.
Figure 3:
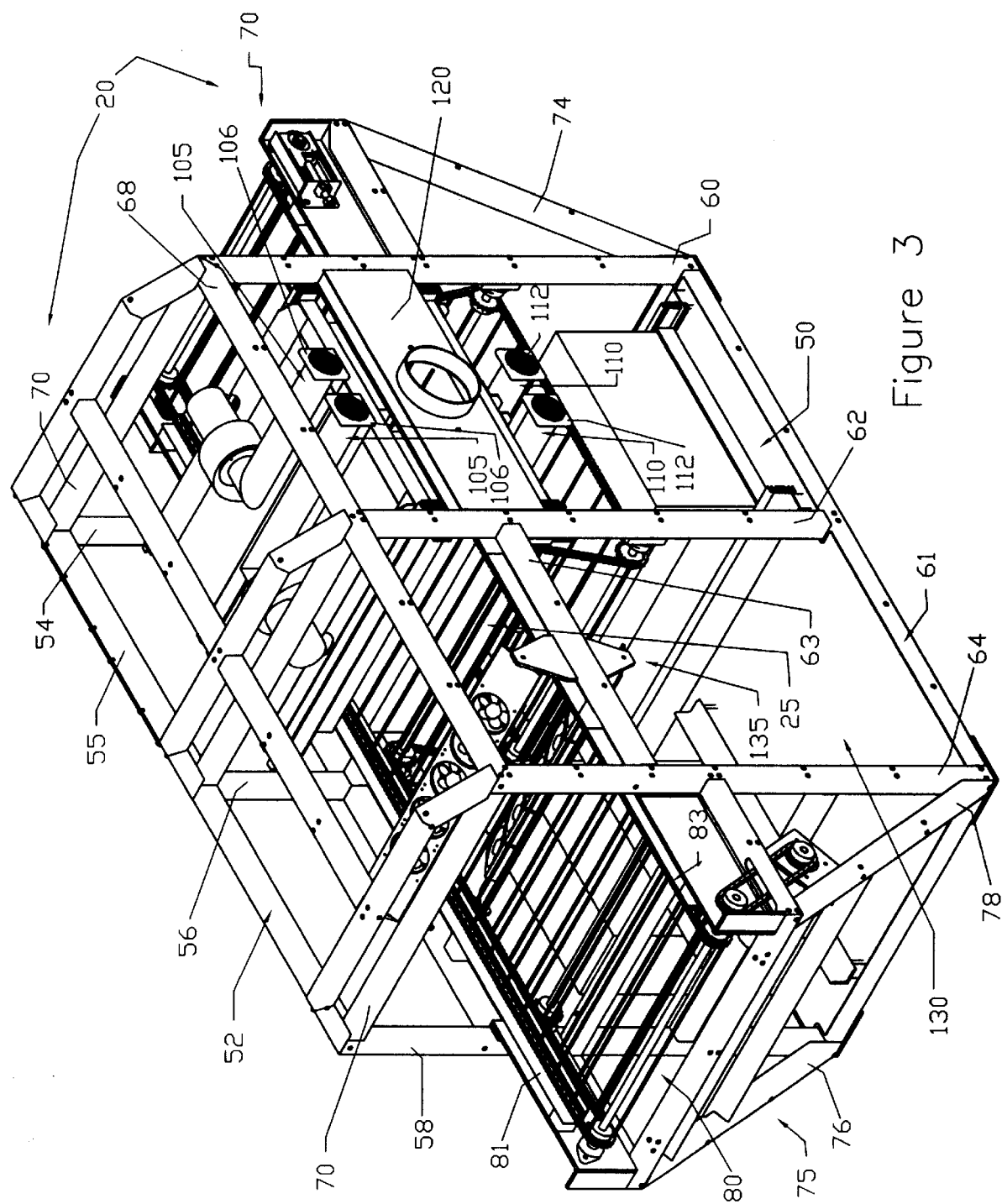
FIG. 3 is a perspective view taken generally from the back thereof, with portions omitted for clarity.
Figure 4:
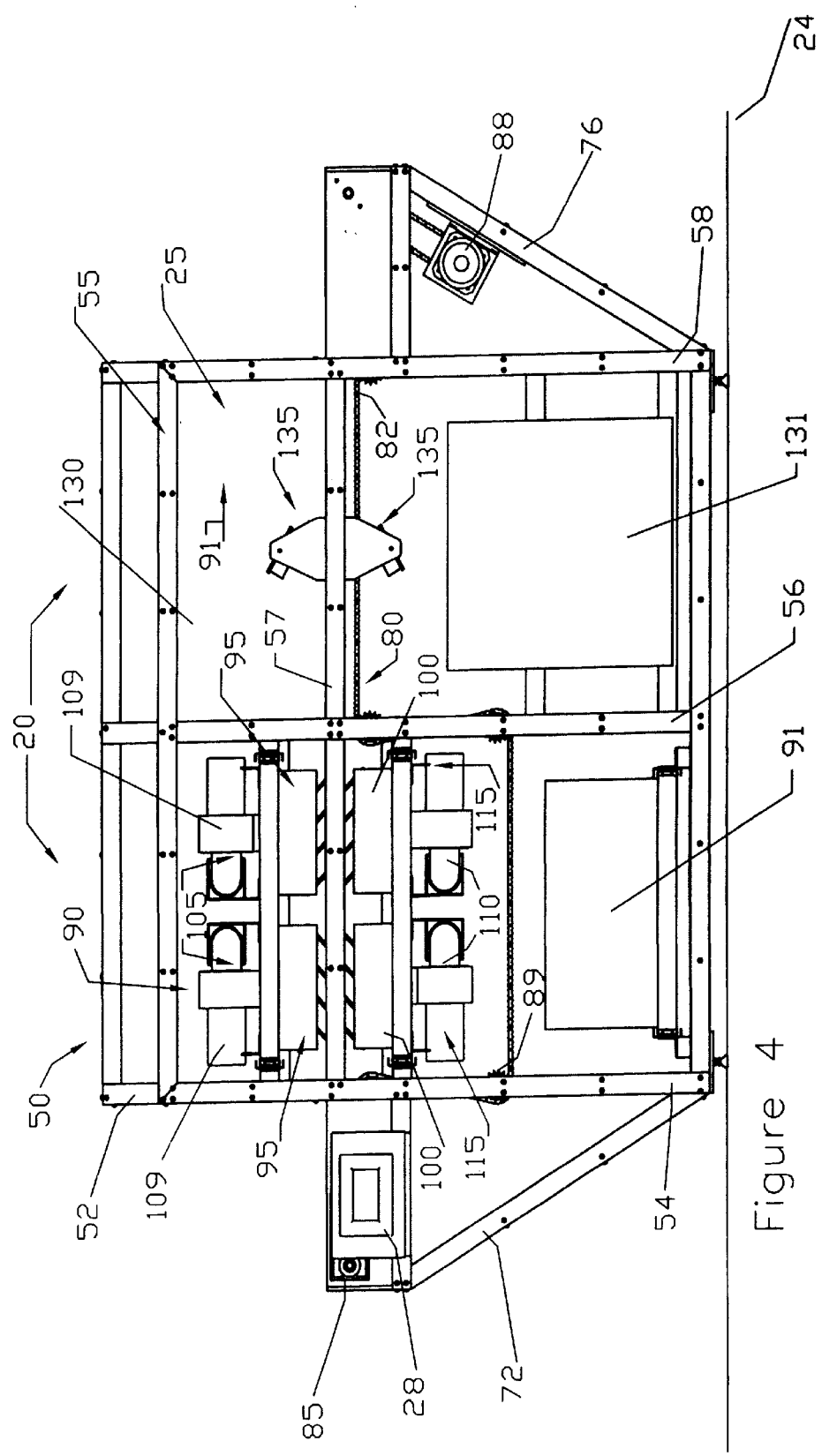
FIG. 4 is a front elevational view thereof, with portions omitted for clarity.
Figure 5:
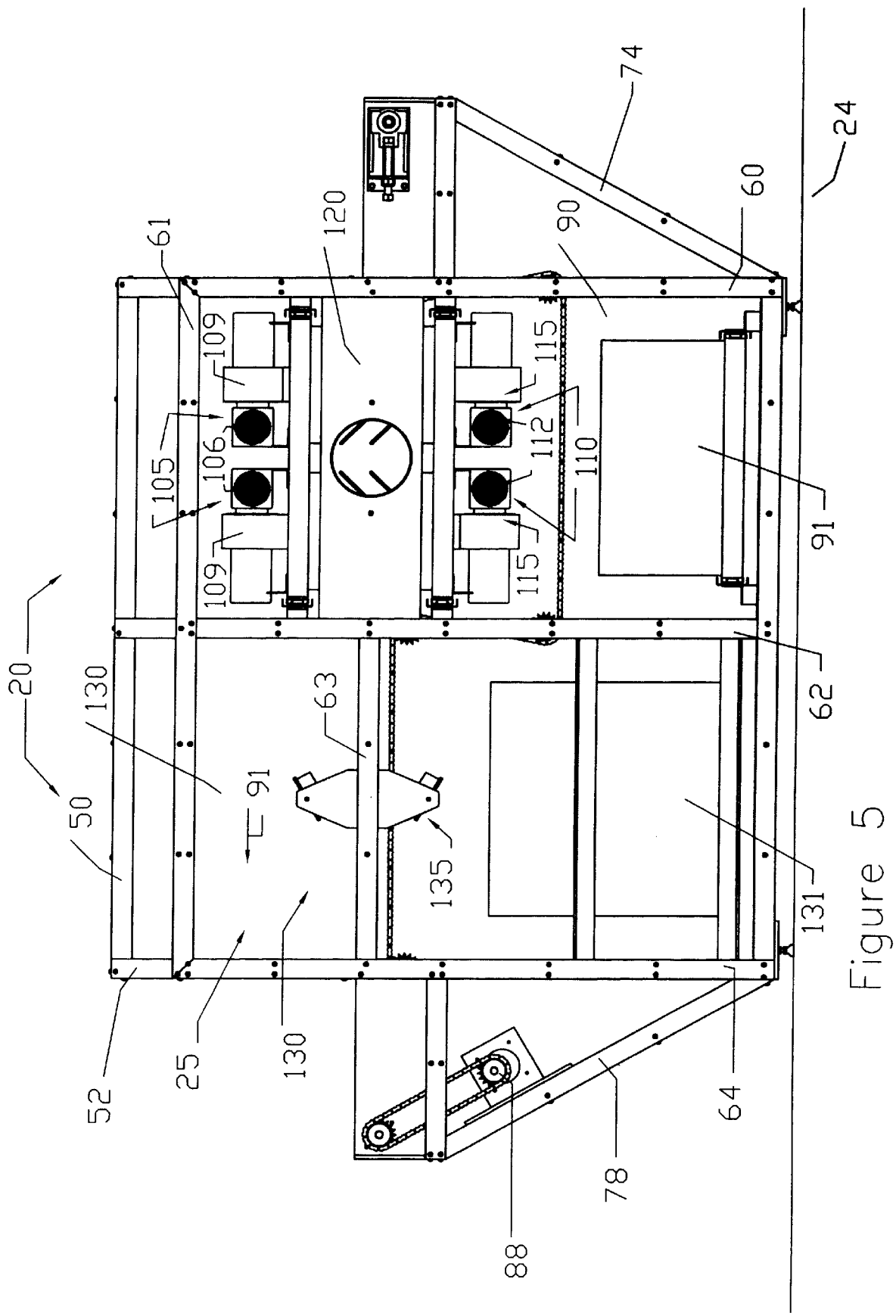
FIG. 5 is a rear elevational view thereof, with portions omitted for clarity.
Figure 6:
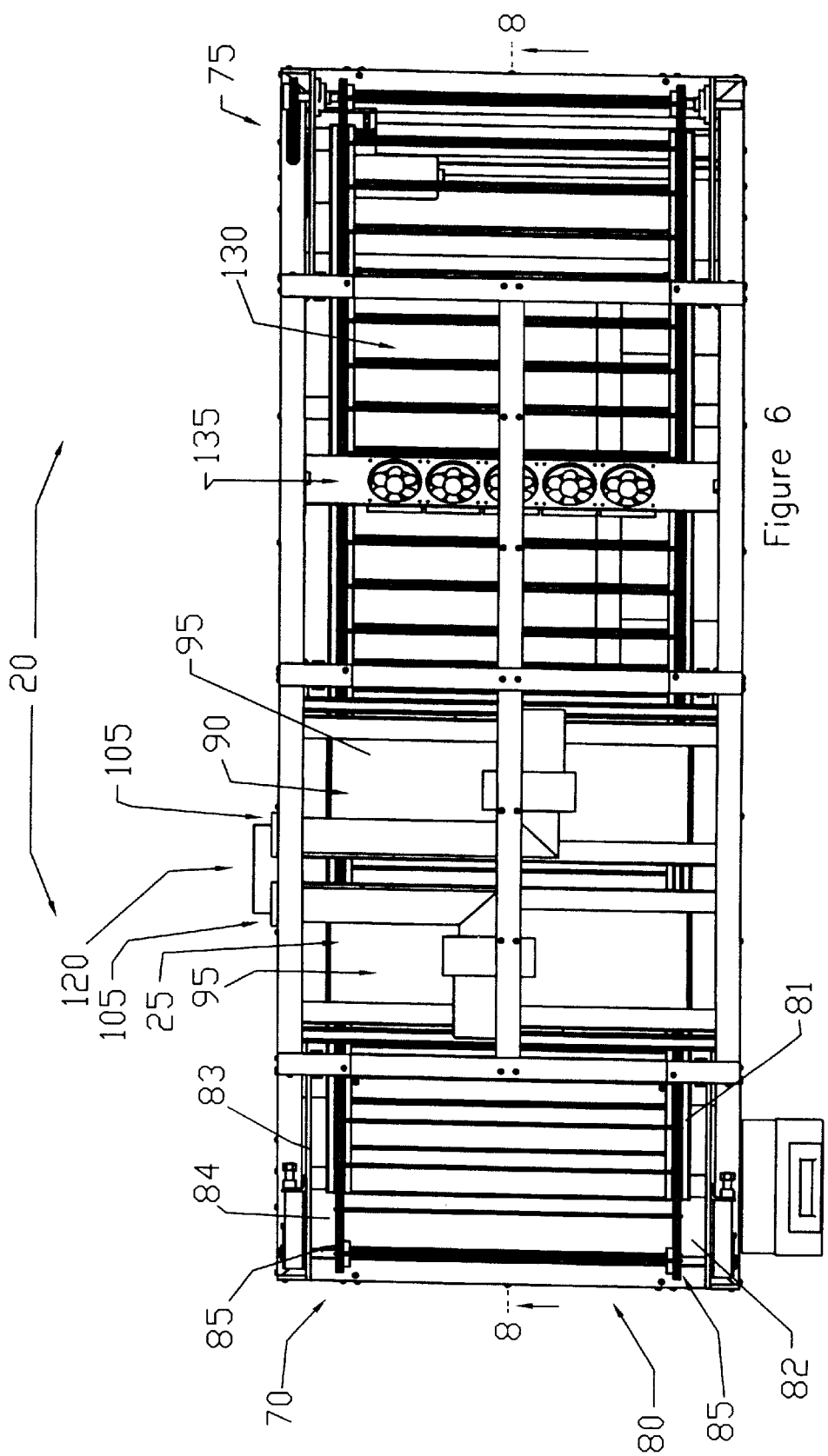
FIG. 6 is a top plan view thereof, with portions omitted for clarity.
Figure 7:
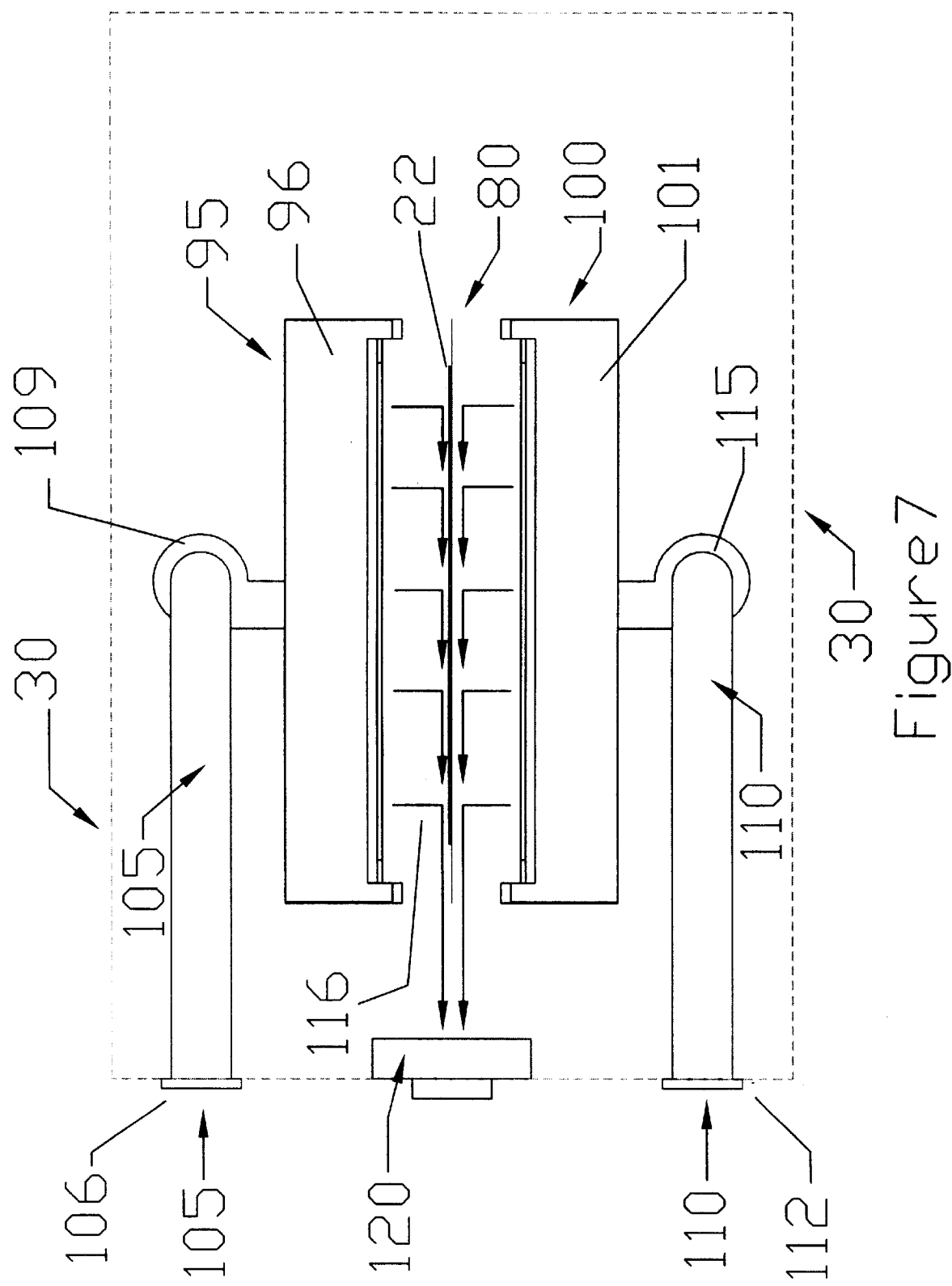
FIG. 7 is a flow diagram depicting pneumatic air flow thereof.
Figure 8:
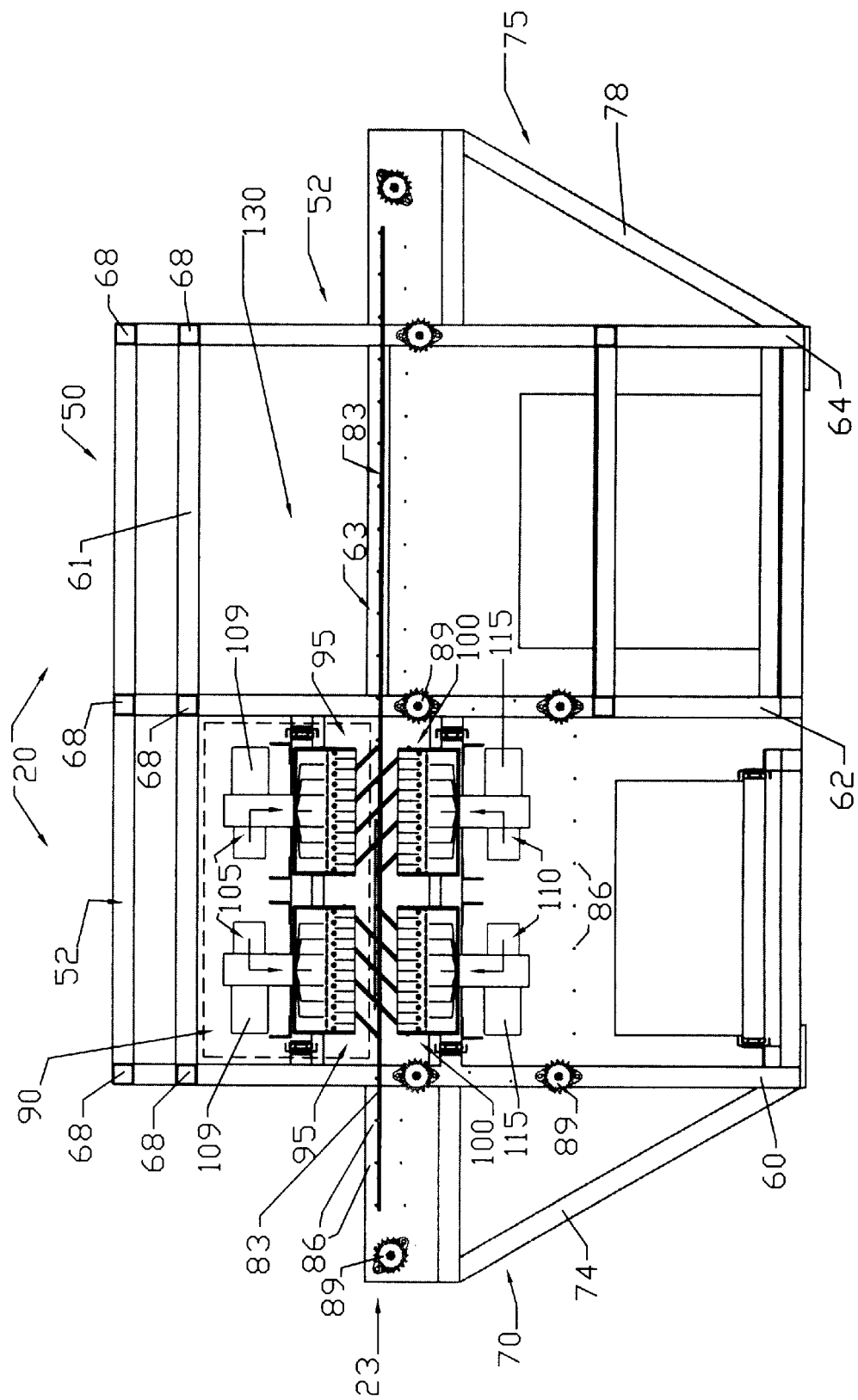
FIG. 8 is a cross-sectional view taken along line 8-8 of FIG. 6, with portions omitted for clarity.
Figure 9:
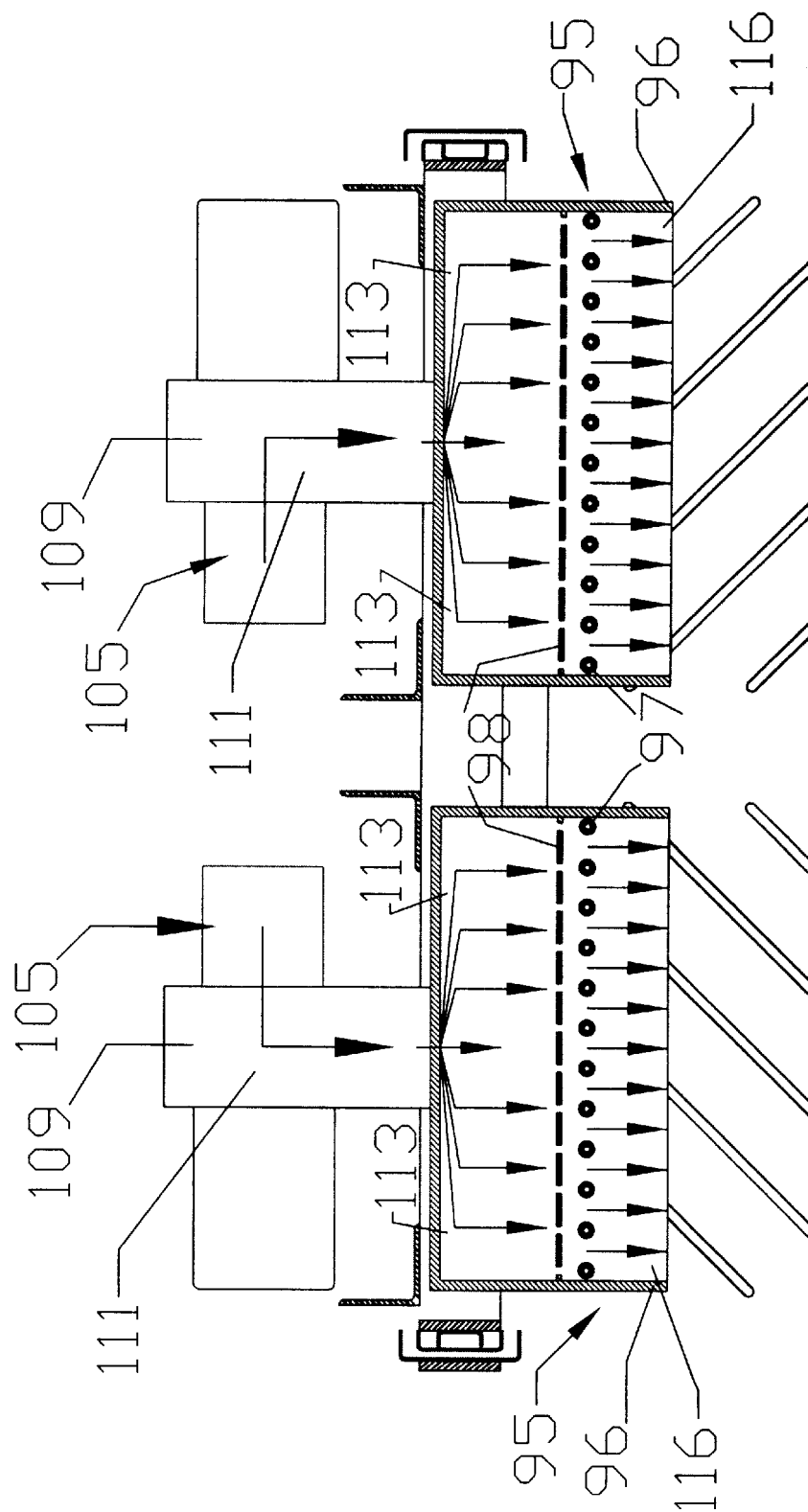
FIG. 9 is an enlarged view of the encircled portion indicated by the dashed lines in FIG. 8, and, FIG. 10 is an enlarged view of the encircled portion indicated by the dashed lines in FIG. 6.
Figure 10:
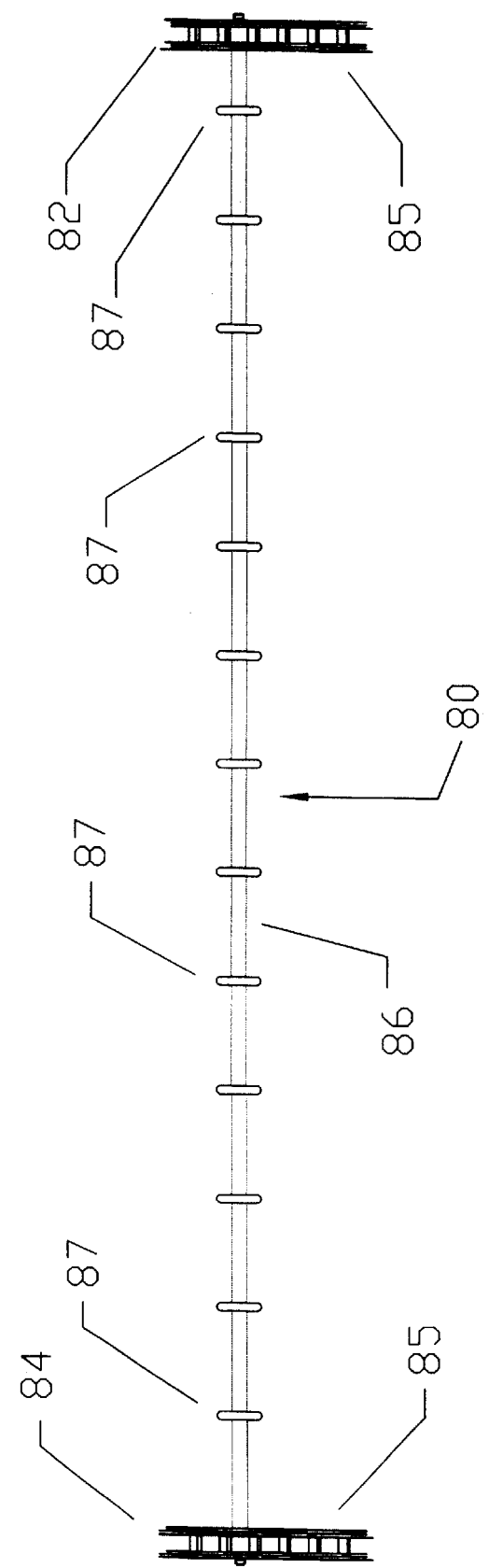

As can be seen in FIGS. 1–10, one exemplary embodiment of an apparatus in accordance with the present invention is generally designated by reference numeral 20. Apparatus 20 may be generally referenced as an oven or variously as a curing-drying system or as a curer-dryer or as a curing-drying oven.

Oven 20 efficiently and safely combines directed air flow for evenly drying and heating with internal infrared emitters that provide thermal energy for curing printed circuit boards 22 being transported though the oven 20 where desirable pneumatic and radiant processes occur simultaneously. The internal geometric configuration of the oven 20 results in airflow streams in relation to the internal panel infrared emitters to ensure that if any flammable vapors are produced, these vapors are kept separated from the panels of infrared emitters.

The conveyorised curing-drying oven 20 uses both convective and radiant heat transport to the printed circuit boards 22 for simultaneous curing and drying. The internal infrared panels for curing and drying printed circuit boards 22 are arranged inside the oven 20 as will be more fully discussed hereinafter. The infrared panels ideally have a high efficiency for energy conversion and generate only a small amount of waste heat. Little or no waste heat to deal with results in internal chambers that require minimal insulation to protect the operators or to provide an acceptable temperature profile in the immediate vicinity of the chambers. Also, the curing-drying chamber does not require elevated temperatures or even the maintenance at a given temperature range of the chamber for curing and drying printed circuit boards 22. The initialization time, i.e. that time from when the apparatus is switched on until it is ready to begin processing printed circuit boards, is extremely short as the panel of infrared emitters are the only operational components that require time to attain the desired operating status. The panel infrared emitters began producing a sufficient radiation flux density in the acceptable wavelengths, which for example could be medium thermal infrared or other acceptable wavelengths and attain operational temperature status in less than one minute.

As mentioned previously, oven 20 is used to simultaneously dry and cure printed circuit boards 22. The oven 20 may be arranged such that printed circuit boards 22 exiting from upstream coating, inking, or developing stations can be automatically unloaded and simultaneously loaded onto the entrance adjacent the front of the oven 20 and then auto unload. Such an arrangement serves to further automate printed circuit board production.

The oven 20 defines a hollow, generally parallelepiped housing 30 substantially enclosing a protected interior 25 along a longitudinal axis 26. The housing 30 defines a front 31, a rear 32, an entrance side 33 and an opposite exit side 35, a top 38 with an opposite bottom 39 adapted to rest upon a firm supporting surface such as floor 24. The housing includes an entrance portal 34 proximate the entrance side 33 and an exit portal 36 proximate the exit side 35.

Various electrical components and connections are located inside the housing enclosure 30. Subsequent wiring is routed as necessary along structural members to the point of use or control. The necessary electrical switches and circuits necessary to install the oven 20 are common to most manufacturing facilities. The oven 20 uses conventional process control equipment and in one exemplary embodiment uses a touch screen display 28 from which all functions of the system are controlled and on which monitoring information is visually displayed. The housing 30 also provides a stable mounting for the a control panel 28 that provides for easy access and is angled to reduce glare, and has no sharp corners exposed to be a safety hazard.

The oven housing 30 is clad with a protective exterior shroud 40. The housing 30 is supported by a rigid inner cabinet frame 50 to which the shroud 40 is coupled.

The shroud 40 includes several discrete panels 42 that may be separately removed from the frame 50 to access the oven interior 25. The shroud 40 serves to isolate the curing-drying and cooling chambers of the oven 20 that are defined within the periphery of frame 50. The shroud 40 is made from materials of sufficient strength to assure the containment of heat and vapors while enabling simple removal of the panels 42 as desired. In one exemplary embodiment, the shroud 40 is made from stainless steel although other non-reactive and substantially rigid materials may be employed as desired.

The shroud 40 also contains stray infrared radiation as well as any vapors that are evaporated from the printed circuit boards 22. The shroud 40 also serves as a pneumatic barrier-container for directed incoming air circulation entering at entrance portal 34 and exit portal 36 in the curing-drying chamber as well as a shield to protect personnel from touching hot printed circuit boards or machine parts that may be heated above safe touching temperatures. In both the curing-drying and cooling chambers, the shroud 40 serves as a protective shield for moving conveyor parts and fans that might cause injury to personnel. The shroud corners have angles designed to reduce their sharpness and thus to improve the safety environment. The shroud 40 also serves to keep electrical conductors from being mechanically damaged and creating an electrical hazard. The shroud 40 does not obstruct the entrance portal 34 or exit portal 36 that permit egress for the printed circuit boards and air flow (to prevent heat from exiting machine and heating up room resulting in increased air conditioning costs) into the oven interior 25. The shroud 40 also provides structural stability by securing panels 42 to portions to the frame 50.

The inner frame 50 includes a rigid inner skeleton 52 that maintains the geometrical integrity of the oven housing 30. Ideally, skeleton 52 is made from materials similar to shroud 40 but such is not necessarily true. In one exemplary embodiment, skeleton 52 is made from stainless steel although other rigid and non-reactive material may be employed as desired.

The skeleton 52 includes several front vertical support members or posts 54, 56, 58 along the plane of the front housing side 31 and several rear vertical support members or posts 60, 62, 64 along the plane of the back housing side 32. Each of the vertical support members 54, 56, 58, 60, 62, 64 extends between the housing bottom 39 and housing top 38. Several front longitudinal struts 55 extend between the planar members 54, 56, 58 along the front housing side 31 to securely establish the relationship of the front planar members relative to each other. Similarly, several rear longitudinal struts 61 extend between the planar members 60, 62, 64 along the rear housing side 32 to securely establish the relationship of the rear planar members relative to each other.

The front and rear vertical members or posts 54, 56, 58, 60, 62, 64 also form front to rear planar pairs along the front and rear housing sides 31 and 32 respectively. That is, members 54 and 60 form a first planar pair, members 56 and 62 form a second planar pair and members 58 and 64 form a third planar pair. Several lateral struts 68 extend between each pair of planar members 54 and 60, 56 and 62, 58 and 64 to securely establish the relationship of the front-to-rear planar pairs relative to each other. The lateral cross-members 68 provide further definition to the housing transverse dimension while longitudinally oriented cross-members 55, 61 do the same for the housing longitudinal axis.

An entrance ramp 70 is secured to the entrance portal 34 to input printed circuit boards into the entrance portal 34 while an exit ramp 75 is secured to the exit portal 36 to output circuit boards from the exit portal 36. A pair of angularly protruding supports 72, 74 protrude outwardly from the housing bottom 39 proximate the first planar pair 54 and 60 at the entrance side 33. The angular entrance pair 72 and 74 terminate proximate the entrance portal 34. Another pair of angularly protruding supports 76, 78 protrude outwardly from the housing bottom 39 proximate the third planar pair 58 and 64 at the exit side 35. The angular exit pair 76 and 78 terminate proximate the exit portal 36.

A transport roller chain conveyor 80 traverses a fixed route defined by guide shelves 81, 83 in housing 30 from proximate the entrance portal 34 to the exit portal 36 to transport printed circuit boards 22 through oven 20. A series of aligned longitudinal struts 57 along the front housing side 31 and another series of aligned longitudinal struts 63 along the rear housing side 32 support the conveyor 80 using conventional spaced apart cogwheels or the like.

The oven conveyor chain 80 includes endless roller chains 82, 84 made of multiple links 85 in a conventional fashion. Each chain 82, 84 traverses a path along the front housing side 31 and rear housing side 32 respectively. The conveyor path is roughly shown by the cross section of each laterally connecting rod 86 and conveyor travel is generally sufficient to move printed circuit boards 22 from the entrance portal 34 to the exit portal 36 in the direction indicated by the arrow identified with reference numeral 23.

The roller chains 82, 84 are connected by several rigid rods 86, which are each made from a material such as stainless steel or the like. Rods 86 are spaced at a distance deemed short enough to provide adequate support for the printed circuit boards while meshing with the roller chain axis. In practice, a distance that has worked acceptably is approximately four inches from center to center. To minimize the blockage of heat transport to the bottom of the printed circuit board, the diameter of the rods is kept in the 0.200-inch to 0.300-inch range. Successive rods 86 are coupled to successive conveyor chain links 85 having a similar diameter.

O-rings 87 may be spaced along the length of each rod 86 to reduce heat transport blockage even further. The O-rings 87 provide adequate support of the printed circuit boards while at the same time minimizing heat transport blockage. In practice, spacing several O-rings 87 along a rod 86 at approximately two-inch intervals has worked acceptably.

Even more reduction of heat transport blockage at a particular printed circuit board surface location can be obtained by providing a mechanism to turn the stainless steel rods 86 as they transverse the curing-drying chamber 90. In this manner the location on the board where heat transport is blocked is continually changing as the printed circuit board traverses the curing-drying chamber.

The conveyor chain is driven at least at one end by an electric drive motor 88 that can be adjusted to give the desired dwell time in the oven 20. The conveyor chain uses a series of aligned cogwheels 89 slidably mounted as well as guide slots defined by the rigid shelves 81, 83 in the housing 30. The shelves 81, 83 and the cogwheels 89 define the conveyor chain routing and provide tensioning. The conveyor chain 80 is routed below the panel infrared emitters and input air ducting during its return from the unloading point to thus prevent the returning conveyor from blocking heat transport to the bottom of the printed circuit board during the curing-drying process.

The vertical posts 54, 56, 58, 60, 62, 64 anchor the route of the conveyor chain 80 through and below the curing-drying chamber 90 and the subsequent cooling chamber 130. The longitudinal struts 60 and 62 provide anchor locations for the conveyor chain guides 89 as well as air ducting 120. Electrical connections and other electrical components are housed in boxes 91 and 131 to provide physical protection to prevent electrical shocks. The struts 57, 63 serve as anchor locations for the battery of cooling fans 135 and the electrical supply conduits for the cooling fans as well as for guides 81 and 83 for the conveyor chain 80. The angled structural members 76, 78 located at the exit ramp 75 serve as the anchor location for the conveyor drive motor 88. The shaped metal shelves 81 and 83 serve as guides for the conveyor chains 82 and 84 to keep their travel routes located in a plane and supporting and protecting both ends of the conveyor chains.

The oven interior 25 includes at least one internal curing-drying zone or chamber 90 followed by at least one internal cooling zone or chamber 130. The internal curing-drying zone or chamber 90 is located generally between the first planar pair 54 and 60 and the second planar pair 56 and 62 and immediately succeeding the entrance portal 34. The internal cooling zone or chamber 130 is located generally between the second planar pair 56 and 62 and the third planar pair 58 and 64 and immediately preceding the exit portal 36.

The curing-drying chamber 90 has input air functioning as a pneumatic barrier on the top as well as the bottom adjacent portal 34. The curing chamber 90 includes at least one bank or panel of infrared emitters 95 located above conveyor 80 and most preferably another bank or panel of infrared emitters 100 located below the conveyor 80 as well. Each of the panels of infrared emitters 95, 100 is located within the ducting 105, 110 of an incoming air stream. Such an arrangement of an upper emitter 95 and ducting 105 coupled with a lower emitter 100 and ducting 110 is generally termed a heating zone. When such a zone is followed immediately by a second series of upper emitter ducting and lower emitter ducting, the oven is typically referred to as a multiple zone oven.

In many installations, it will be desirable to utilize multiple heating zone ovens that include additional subsequent emitters with associated ductwork and additional incoming air streams that will have the same structure and function as the initial upper and lower emitters and ducting. For example, in the exemplary embodiment described herein two zones of matching upper and lower emitters and ducting are shown but only one set of upper and lower emitters and ductwork will be described in detail. It is to be explicitly understood that additional banks of upper and lower emitters may be added as desirable to accomplish the necessary goals for a particular throughput. Of course, the addition of such zones increases the physical size of the oven and such is to be avoided when possible. In practice, it has been determined that a two-zone oven is sufficient to treat most printed circuit boards.

Regardless of the number of zones, all of the emitters and their incoming air streams operate concurrently to thus cure and simultaneously dry the printed circuit boards 22 as they traverse the oven interior 25 on the conveyor 80 as indicated by directional arrow 23.

The infrared 95, 100 emitters are operated at a sufficient electrical voltage to produce thermal infrared radiation with wavelengths near one to ten microns which is in the medium thermal infrared range. In practice, the operating voltage of about 240 volts AC provided satisfactory results and is easily obtained at most electrical supply boxes and no special transformers or circuits from the electrical utility company.

Each ductwork 105, 110 includes an inlet port 106, 112 mounted to the exterior housing 30 on the rear side 32. Each port 106, 112 may be desirably filtered to exclude particulate materials or the like. Each port 106, 112 thence is secured to appropriate ducting 108, 114 that provides a communicative pathway to the respective infrared emitters 95, 100 through an associated squirrel cage blower 109, 115.

Each emitter 95, 100 includes a housing 96, 101 receiving incoming air (indicated by arrow 111) from ducting 105, 110. Housing 96 (and each housing is similar) includes a constricting baffle 98 that uses the pneumatic properties of the air (indicated by arrows 113) to produce essentially equal flow rates at each outlet slot in the baffle so that the air (indicated by arrows 116) flows directly into and through the individual infrared emitters 97. Thus the heating of the transient air stream is greatly facilitated. A combination of velocity and partial path obstruction by the infrared emitters will result in turbulent flow, a flow pattern that vigorously mixes the air, providing an overall air stream with a homogenous internal temperature and transport velocity as it nears the printed circuit boards.

Air leaving the intake ducting through the emitters is traveling in a direction perpendicular to the printed circuit board surfaces on the conveyor 80. This air stream will possess perpendicular force vectors that apply pressure during the curing-drying process that push the photoimaginable solder mask against the printed circuit board's core. Simultaneously, the thickness of the limited mobility air layer that is immediately adjacent to the printed circuit board surfaces will be actively reduced thus facilitating heat transfer from the air stream to the printed circuit boards as well as the evaporation of the solvent vapors up and out of the photoimaginable solder masks. In the curing-drying process the air stream is directed simultaneously to both sides of the printed circuit boards 22 from a perpendicular direction. There is a point when the pneumatic conditions near the printed circuit board surface will cause the air to change direction and move down a pressure gradient to the exhaust vent 120.

The positive pressure on the air produced by the squirrel-cage fans, the flow of the air directed through the baffle arrangements, and the air flow rate are sufficient to prevent backward flow of any vapors originating from the printed circuit board 22 to the panel of infrared emitters where, if flammable, they could ignite. The airflow is produced using squirrel-cage fans located in each ducting for each panel infrared emitter. The airflow path from each intake vent is through ducts to the squirrel-cage fan and into the expansion chamber located directly above a directive baffle, then through the directive baffle that breaks it up into several small streamlets with nearly equal flow rates while directing each streamlet past an infrared emitting element in the panel of infrared emitters, recombines the streamlets into one stream having homogenous temperatures and transport velocities, and then blows against the printed circuit boards surface. At this point the air is no longer isolated in a containing air duct but is free to mix with air from the other air intake ducts in the curing-drying chamber 90 as the air generally moves out of the curing-drying chamber 90 through the exhaust vent manifold 120. The restriction of air entry to the intake ports facilitates the use of filters to scrub the incoming air to remove impurities. Similarly, the restriction of essentially all vapors arising from the printed circuit board to exit via the exhaust vent 120 would allow a scrubber to be installed if it was desired to remove these vapors contained in the spent air stream or ducts to be installed if it was desired to direct the exhaust out of the building.

As the conveyor chain 80 transports the printed circuit board 22 into the curing-drying chamber 90, the conveyor chain and transported printed circuit board passes through the slot-shaped entrance portal 34 that is as small as is prudently practical to reduce air seepage out of the curing-drying chamber 90 by routes other than the exhaust vent 120.

After the printed circuit board 22 exits the curing-drying chamber 90, it passes into the cooling chamber 130 where it is subjected to an air stream from above and below arising from a battery 135 of rotary fans mounted above and below conveyor 80. These fans direct the cooling air at the board at a slight angle (20 to 45 degrees) to the direction 23 of conveyor chain movement.

The pneumatic air flows in the system are designed to apply nearly equal up and down forces simultaneously so that the printed circuit boards 22 will not be blown around. Furthermore, the non-perpendicular forces acting on the upper and lower surfaces of the printed circuit board resulting from the pneumatic air flow are insufficient to move the printed circuit boards from its position on the conveyor chain 80. Thus, there are no resultant forces pushing the printed circuit board 22 against the conveyor chain components that could cause the printed circuit board to become physically impaired nor is there a need to secure the printed circuit board to the conveyor chain 80 to prevent it from being physically moved and damaged. The weight of the printed circuit board its self provides sufficient inertia to prevent it from moving on the conveyor chain 80.

The printed circuit board 22 exits the cooling chamber 130 onto the exit ramp 75 where it is supported on the conveyor chain 80 in an unobstructed position for physical manipulation (loading, unloading, turning, etc.) or automated direct unloading onto another manufacturing station.

The photoimaginable solder mask on each printed circuit board 22 emerging from the curing-drying oven 20 has a surface hardness rating of 9H (on the pencil lead scale).

From the foregoing, it will be seen that this invention is one well adapted to obtain all the ends and objects herein set forth, together with other advantages which are inherent to the structure.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and not in a limiting sense.

What is claimed is:

1. An oven apparatus for drying and curing a printed circuit board, said apparatus comprising:
    a housing with sides and having an entrance and exit bounding a hollow interior defining a plurality of chambers between said entrance and said exit;
    a driven conveyor traversing a route through said housing between said entrance and said exit, said conveyor adapted to transport a printed circuit board from said housing entrance to said housing exit;
    one of said plurality of chambers comprising a combined curing and drying chamber adapted to simultaneously cure and dry a printed circuit board being transported through said housing on said conveyor, said curing and drying chamber having at least one panel of infrared emitters located on one side of said conveyor route and at least one panel of infrared emitters located on the other side of said route;
    a plurality of inlet fluid passages communicatively associated with each of said panels of infrared emitters and a common fluid outlet, said inlet passages adapted to forcefully move air from the exterior of said housing through said curing and drying chamber to said outlet while compartmentalizing the moving air such that the air is first heated by said infrared emitters and then blown against said conveyor without returning to a position adjacent any of said infrared emitters.

2. The apparatus as recited in claim 1 wherein said another of said plurality of chambers comprises a cooling chamber that cools printed circuit boards traversing said chamber by blowing ambient air thereon.

3. The apparatus as recited in claim 1 wherein said driven conveyor comprises a pair of spaced apart elongated chains are connected laterally by a plurality of regularly spaced apart rigid bars, each of said chains traversing said housing between said entrance and said exit adjacent opposite housing sides.

4. The apparatus as recited in claim 3 wherein each of said rods comprises an elongated rigid structure with a plurality of spaced apart circumferentially mounted elastomeric bands.

5. The apparatus as recited in claim 4 wherein each of said rods is rotatably mounted to each of said chains.

6. The apparatus as recited in claim 1 wherein each of said inlet fluid passages comprises an air inlet having a filtered port through the exterior of said housing to draw exterior air into said housing interior.

7. The apparatus as recited in claim 6 wherein each of said ports is connected to an internal blower by internal ducting extending therebetween and said internal blower forcefully expels air through said infrared emitters.

8. The apparatus as recited in claim 6 wherein said forcefully expelled air strikes said conveyor transversely.

9. An oven apparatus for drying and curing a printed circuit board, said apparatus comprising:
    a housing with sides and having an entrance and exit bounding a hollow interior defining a plurality of chambers between said entrance and said exit;
    a driven conveyor traversing a route through said housing between said entrance and said exit, said conveyor adapted to transport a printed circuit board from said housing entrance to said housing exit;
    one of said plurality of chambers comprising a combined curing and drying chamber adapted to simultaneously cure and dry a printed circuit board being transported through said housing on said conveyor, said curing and drying chamber having at least one panel of infrared emitters located on one side of said conveyor route and at least one panel of infrared emitters located on the other said route;
    a plurality of inlet fluid passages communicatively associated with each of said panels of infrared emitters and a common fluid outlet and wherein each of said passages comprises an air inlet having a filtered port through the exterior of said housing to draw exterior air into said housing interior and each of said ports is connected to an internal blower by internal ducting extending therebetween and said internal blower forcefully expels air, said inlet passages adapted to forcefully move air from the exterior of said housing through said curing and drying chamber to said outlet while compartmentalizing the moving air such that the air is first heated by said infrared emitters and then blown against said conveyor without returning to a position adjacent any of said infrared emitters.

10. The apparatus as recited in claim 9 wherein said another of said plurality of chambers comprises a cooling chamber that cools printed circuit boards traversing said chamber by blowing ambient air thereon.

11. The apparatus as recited in claim 9 wherein said driven conveyor comprises a pair of spaced apart elongated chains are connected laterally by a plurality of regularly spaced apart rigid bars, each of said chains traversing said housing between said entrance and said exit adjacent opposite housing sides.

12. The apparatus as recited in claim 11 wherein each of said rods comprises an elongated rigid structure with a plurality of spaced apart circumferentially mounted elastomeric bands.

13. The apparatus as recited in claim 12 wherein each of said rods is rotatably mounted to each of said chains.

14. The apparatus as recited in claim 9 wherein said forcefully expelled air strikes said conveyor transversely.

15. An oven apparatus for drying and curing a printed circuit board, said apparatus comprising:

a housing with sides and having an entrance and exit bounding a hollow interior defining a plurality of chambers between said entrance and said exit;

a driven conveyor traversing a route through said housing between said entrance and said exit, said conveyor adapted to transport a printed circuit board from said housing entrance to said housing exit, said driven conveyor comprises a pair of spaced apart elongated chains are connected laterally by a plurality of regularly spaced apart rigid bars, each of said chains traversing said housing between said entrance and said exit adjacent opposite housing sides and wherein each of said rods comprises an elongated rigid structure with a plurality of spaced apart circumferentially mounted elastomeric bands;

one of said plurality of chambers comprising a combined curing and drying chamber adapted to simultaneously cure and dry a printed circuit board being transported through said housing on said conveyor, said curing and drying chamber having at least one panel of infrared emitters located above said conveyor route and at least one panel of infrared emitters located below said route;

a plurality of inlet fluid passages communicatively associated with each of said panels of infrared emitters and a common fluid outlet, said inlet passages adapted to forcefully move air from the exterior of said housing through said curing and drying chamber to said outlet while compartmentalizing the moving air such that the air is first heated by said infrared emitters and then blown against said conveyor without returning to a position adjacent any of said infrared emitters.

16. The apparatus as recited in claim 13 wherein each of said rods is rotatably mounted to each of said chains.

17. The apparatus as recited in claim 14 wherein each of said inlet fluid passages comprises an air inlet having a filtered port through the exterior of said housing to draw exterior air into said housing interior.

18. The apparatus as recited in claim 15 wherein each of said ports is connected to an internal blower by internal ducting extending therebetween and said internal blower forcefully expels air through said infrared emitters.

19. The apparatus as recited in claim 15 wherein said forcefully expelled air strikes said conveyor transversely.

* * * * *